(12) United States Patent
Withers (10) Patent No.: US 7,295,009 B2
(45) Date of Patent: Nov. 13, 2007

(54) PLANAR NMR COIL WITH GYROMAGNETIC ARC SUPPRESSION

(75) Inventor: Richard S. Withers, Sunnyvale, CA (US)

(73) Assignee: Bruker BioSpin Corporation, Billerica, MA (US)

( * ) Notice: Subject to any disclaimer, the term of this patent is extended or adjusted under 35 U.S.C. 154(b) by 606 days.

(21) Appl. No.: 10/796,948

(22) Filed: Mar. 10, 2004

(65) Prior Publication Data

US 2005/0200359 A1    Sep. 15, 2005

(51) Int. Cl.
*G01V 3/00* (2006.01)
(52) U.S. Cl. ............................... 324/318; 324/322
(58) Field of Classification Search ........ 324/318–322; 600/422
See application file for complete search history.

(56) References Cited

U.S. PATENT DOCUMENTS

| | | | |
|---|---|---|---|
| 5,276,398 A * | 1/1994 | Withers et al. | 324/318 |
| 5,585,723 A * | 12/1996 | Withers | 324/318 |
| 5,594,342 A * | 1/1997 | Brey et al. | 324/322 |
| 6,169,399 B1 * | 1/2001 | Zhang et al. | 324/318 |
| 6,590,394 B2 * | 7/2003 | Wong et al. | 324/318 |
| 6,727,700 B2 * | 4/2004 | Marek | 324/318 |
| 6,842,004 B2 * | 1/2005 | Withers et al. | 324/318 |
| 7,078,902 B2 * | 7/2006 | Freytag et al. | 324/318 |
| 2002/0190715 A1 * | 12/2002 | Marek | 324/318 |
| 2003/0052682 A1 * | 3/2003 | Withers | 324/322 |
| 2003/0062896 A1 * | 4/2003 | Wong et al. | 324/318 |
| 2004/0032262 A1 * | 2/2004 | Withers et al. | 324/318 |
| 2005/0200359 A1 * | 9/2005 | Withers | 324/318 |
| 2005/0237060 A1 * | 10/2005 | Freytag et al. | 324/318 |

* cited by examiner

*Primary Examiner*—Diego Gutierrez
*Assistant Examiner*—Tiffany A. Fetzner
(74) *Attorney, Agent, or Firm*—The Law Office of Paul E. Kudirka (57) ABSTRACT

A magnetic resonance RF coil comprises a conductive material deposited on a dielectric substrate. The conductive material includes magnetic field generating elements used to generate an RF magnetic field and interdigital capacitor elements. The capacitor elements are oriented parallel to the magnetic field generating elements and, therefore, to a main static magnetic field within which the coil is to be located. This orientation minimizes arcing resulted from emitted electrons and helps to prevent catastrophic breakdown of the coil.

34 Claims, 5 Drawing Sheets

PLANAR NMR COIL WITH GYROMAGNETIC ARC SUPPRESSION

FIELD OF THE INVENTION

This invention relates to radio frequency (RF) probes for nuclear magnetic resonance (NMR) spectroscopy and microscopy and, more particularly, to resonant coils for the transmission and reception of NMR signals.

BACKGROUND OF THE INVENTION

In an NMR spectrometer probe, a sample is placed in a static magnetic field which causes atomic nuclei within the sample to align in the direction of the field. Transmit and receive coils, which may be combined in a single coil or set of coils, are placed in the probe positioned close to the sample. The transmit coils apply an RF magnetic field orthogonal to the direction of the static magnetic field, perturbing the alignment of the nuclei. The transmit signal is then turned off, and the resonant RF signal of the sample is detected by the receiver coil. The sensitivity of the spectrometer depends on a number of factors, including the strength of the static field, the closeness of the coupling between the RF coils and the sample, and the resistance of the RF coil.

Currently, most commercial NMR spectrometers use RF coils made of a normal metal, such as copper, or a combination of normal metals, although the use of superconductors in place of conventional normal metal for RF coils in NMR spectrometers may become more commonplace. The advantage to be obtained with high temperature superconductor ("HTS") coils is significant. HTS coils have very low resistance and are operable in high magnetic fields at temperatures achievable with currently readily available refrigeration systems (above 10K). Cooling of RF coils to reduce their resistance has also been suggested to reduce overall coil resistance. In addition, much research has been devoted to the design of coils for maximum sensitivity. For example, to achieve close coupling, coils have been made that include configurations such as solenoids, saddle coils and birdcage coils, all of which have high filling factors. However, the introduction of HTS materials has led to coil designs that further explore the use of planar coil layouts.

Thin-film HTS coils offer design and processing challenges not present with normal-metal coils. First, commonly used high-temperature superconductors are perovskite ceramics, which require a well-oriented crystal structure for optimum performance. Such orientation is extremely difficult to achieve on a nonplanar substrate. Generally, such coils are preferably deposited epitaxially on a planar substrate. This makes the achievement of a high filling factor more challenging. It is also desirable for the coil to be deposited in a single layer of superconducting film, without crossovers. Second, the coil must be able to handle relatively high currents while producing a uniform magnetic field and avoiding distortion of the $B_0$ field of the magnet.

U.S. Pat. No. 5,565,778 to Brey, et al. discloses a number of different configurations of a probe for NMR spectroscopy. Each of these configurations uses a coil having conductors mounted on a planar substrate. The conductors are arranged such that the coil includes at least one interdigital capacitor. That is, interleaved conductors having a constant spacing between them are located on the substrate. Each conductor surrounds a central sample location and lies closely adjacent to at least one other conductor. None of the conductors completely surrounds the sample location on its own, but the conductors are in an alternating arrangement such that adjacent conductors have respective breaks in their conductive paths at different radial positions relative to the sample location. This results in a capacitive configuration that forms a coil surrounding the sample location.

Figure 1:
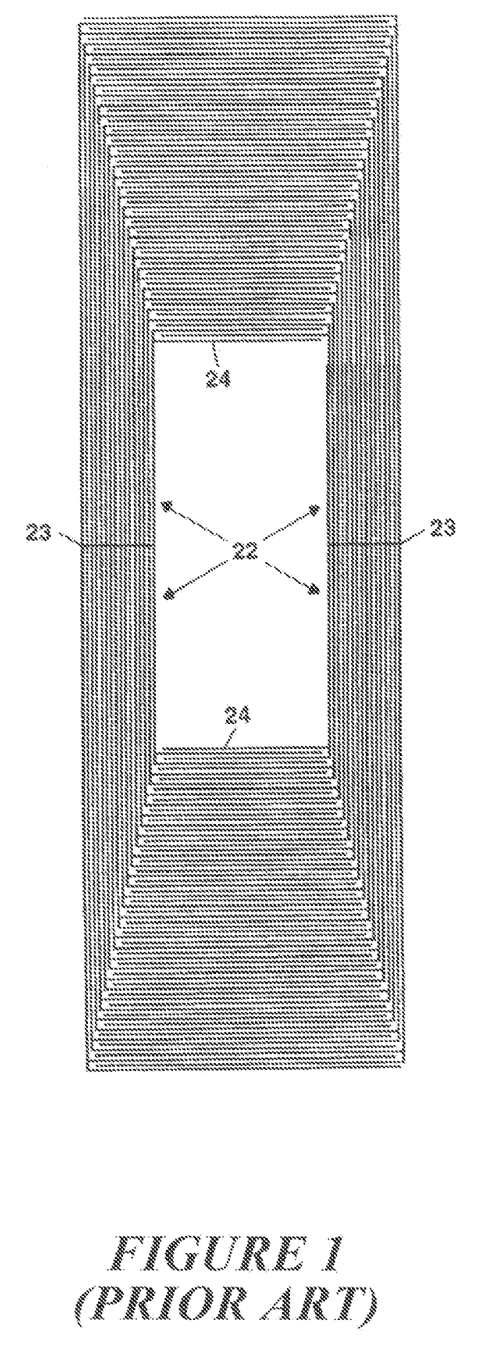
FIG. 1 is a schematic view of a prior art NMR coil having a generally oblong shape.

In another recent patent, U.S. Pat. No. 6,556,013 to Withers, planar coil layouts were further refined, and an example of one of these is reproduced in FIG. 1. As shown, the Withers patent describes an oblong conductor layout that allows the magnetic field-generating conductive elements 22 to be closer to the sample volume than the interdigital capacitive elements 24. That is, the capacitors are segregated to the "top" and "bottom" of the coil, and the vertical elements along the coil sides are used as the primary RF magnetic field generating components. Thus, the magnetic field that is generated has a stronger influence on a sample than it would if the same conductors were located in the top and bottom of the coil, which are further away. This arrangement retains the benefit provided by the capacitors, while keeping them away from the sides of the coil, where they would otherwise limit the magnetic field generating capacity of the vertical elements. The vertical elements on each side of the coil are also electrically connected to one another by optional conductive nodes 23.

In both HTS and normal metal coils, coil failure can result during the transmit pulse when operating the coils at their expected high voltages. These failures are thought to be caused by a number of different factors, but typically result in a catastrophic breakdown between some of the relatively narrow coil conductors, and ultimate destruction of parts of the coil. It is thought that minute material defects, contamination and unexpected power surges can trigger arcing between coil conductors, which can have a cascading effect throughout the coil. The incidences of arcing typically occur in the capacitive region of the coil, where high voltages dominate. The arcing in an HTS coil renders parts of the capacitors nonconductive, causing the coil's resonant frequency to rise, often to the point that the coil is no longer usable.

SUMMARY OF THE INVENTION

In accordance with the present invention, a planar RF NMR coil is provided that greatly reduces coil failures by orienting the capacitive elements within the coil so as to minimize the incidence of coil arcing. The coil, a magnetic resonance radio frequency resonator, generates a magnetic field in an active sample volume, and has a dielectric substrate upon which is deposited a conductive material. The conductive material forms a plurality of nested current carrying loops each of which has magnetic field generating elements and interdigital capacitor elements, and together which form a substantially closed geometric path surrounding an inner region that lies adjacent to the active sample volume. To minimize arcing, the interdigital capacitor elements are oriented in a direction that is substantially parallel to the orientation of the magnetic field generating elements. Since the resonator is configured to be located in a static magnetic field such that the magnetic field generating elements run parallel to the direction of the static magnetic field, the capacitor elements are likewise parallel to the static magnetic field, which thus runs perpendicular to a path between adjacent capacitor elements. The electric field in the capacitor elements is thereby substantially perpendicular to the static magnetic field, and as a result any electron emitted by any of the interdigital capacitor elements will be deflected by the resulting gyromagnetic force and, for typical electric and magnetic field strengths, will not be able to reach (and damage) neighboring capacitor elements.

The conductive element of the resonator may be a superconducting material or may be a normal metal. In one embodiment, the inner region that lies adjacent to the sample volume is oblong in shape, having a major axis parallel to its longer dimension and a minor axis parallel to its shorter dimension. In this embodiment, the magnetic field generating elements run substantially parallel to the major axis of the inner region. Of course, the interdigital capacitor elements also run parallel to the major axis. However, it may be desirable to locate the capacitor elements adjacent to the shorter sides of the oblong shape and the magnetic field generating elements adjacent to the longer sides of the oblong shape so that the magnetic field generating elements are closer to the center of the sample volume.

The particular layout of the magnetic field generating elements and the interdigital capacitor elements may vary from one coil to the next. However, the coil may benefit from having the capacitor elements in an orientation that ensures a minimum amount of electric field energy in the direction of the static magnetic field. In particular, a good practical orientation would be such that the square of the peak electric field in the direction of the static magnetic field is less than 10% of the sum of the squares of the peak electric fields in each of the two perpendicular directions. In this way, the electric field of the capacitor elements and the static magnetic field remain significantly perpendicular for limiting the incidence of arcing.

The capacitor elements typically comprise conductive fingers that are separated by thin, non-conducting gaps which also run parallel to the static magnetic field. The magnetic field generating elements include primary portions that run parallel to the major axis of the oblong shape, but may also include lateral portions that run substantially perpendicular to the major axis to allow them to connect to the capacitor elements. Since each of these lateral elements takes up space on the substrate, the primary portions of the magnetic field generating elements may thus be different lengths to accommodate the different positions of the lateral portions. In one embodiment of this type, a group of the magnetic field generating conductors that is located to one side of the oblong shape would then have an overall shape that is substantially trapezoidal. Overall, the interdigital capacitor elements will together make up one or more capacitors connected in series with the magnetic field generating elements.

BRIEF DESCRIPTION OF THE DRAWINGS

The above and further advantages of the invention may be better understood by referring to the following description in conjunction with the accompanying drawings in which.

DETAILED DESCRIPTION

Figure 2:
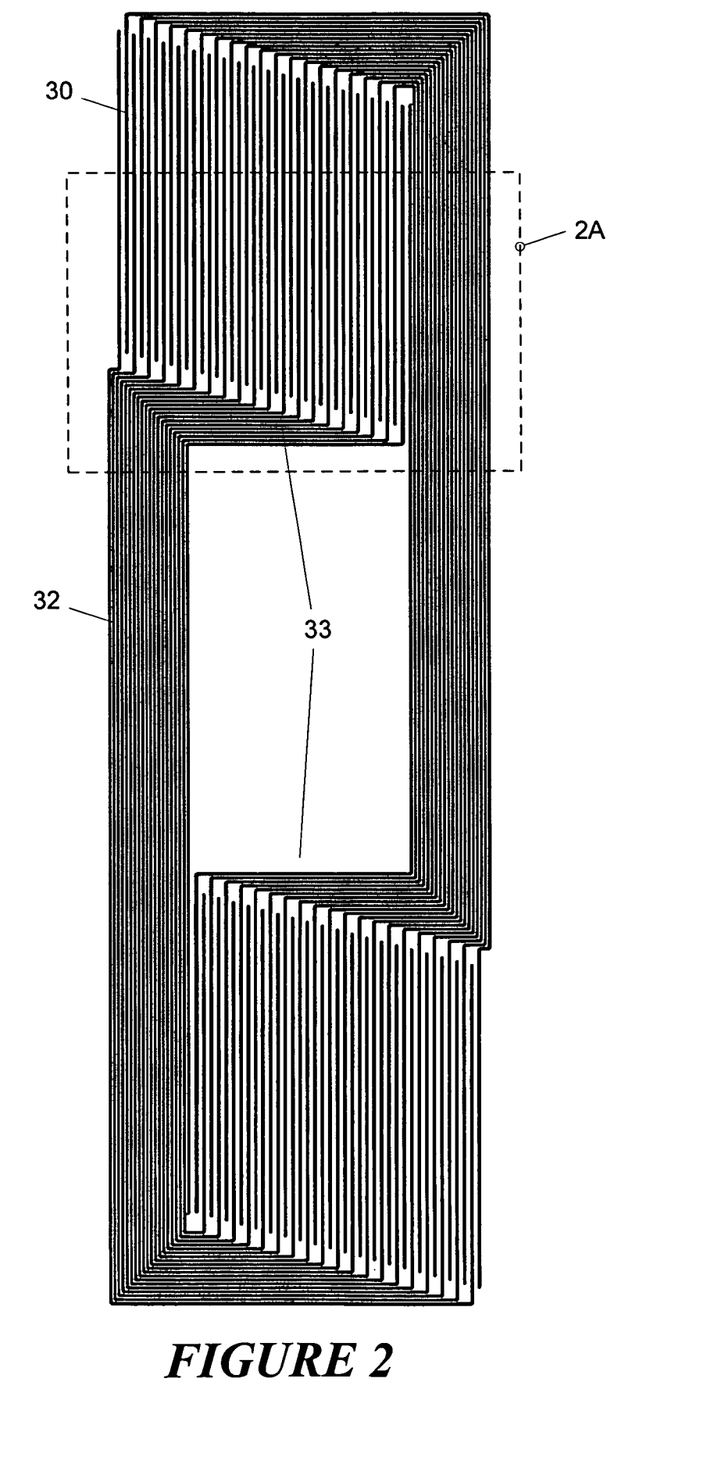
FIG. 2 is a schematic view of an NMR coil according to the present invention that has interdigital capacitor elements that run parallel to magnetic field generating elements of the coil.

Shown in FIG. 2 is a schematic view of a first coil embodiment. The view is schematic partly in that it is shown with conductors at an exaggerated scale. That is, in order to depict clearly the configuration of the coil conductors, they are shown much thicker in the drawing figures, and with a correspondingly lower number of conductors per coil. In the coil of FIG. 2, two interdigital capacitors are used, one above the active sample volume and one below it. However, unlike the prior art coil shown in FIG. 1 the capacitive fingers of the FIG. 2 coil are oriented parallel to the vertical magnetic field generating elements. The capacitors are in series, and consist of vertical conductors 30, which are also referred to herein as "fingers." The capacitors are electrically connected to the magnetic field generating elements 32 via lateral portions 33 of those elements. In this embodiment, all conductors of the coil are a high-temperature superconducting (HTS) material, although the principles of the invention apply to normal metal conductors as well. The HTS conductors are epitaxially grown on an appropriate crystalline substrate, such as sapphire. As known in the art, the HTS film is epitaxially grown on the crystalline substrate, which is chosen for having a lattice spacing that is appropriate for the HTS material. Thus, for normal metal conductors, the substrate would likely be different. The magnetic field generating conductors 32 are of uniform width and are straight along the sides of the coil, and they are separated from one another by only enough of a gap to suppress the magnetization of the superconducting film. Near the top and bottom of the coil, the lateral portions 33 of the conductors 32 turn inward to connect to the capacitive elements 30.

In this embodiment of the invention, the capacitors are located at the "top" and "bottom" of the coil, relative to the orientation shown in FIG. 2. Sample containers tend to be oblong in shape, that is, longer in one direction than in a perpendicular direction. Therefore, coils are typically also oblong, and can be described relative to a major and a minor axis. The major axis extends through the center of the sample region along the longer dimension of the coil, while the minor axis extends through the center of the sample region along the shorter dimension of the coil. Thus, in this context, the "top" and "bottom" of the coil are those coil portions that intersect the major coil axis. Since the conductors along the sides of the coil are closer to the sample volume, the magnetic field that they generate has a stronger influence on the sample than it would if the same conductors were located in the top and bottom of the coil, which are further away. Thus, in the present invention, the capacitors are segregated to the top and bottom of the coil, and the vertical elements along the coil sides are used as the primary RF magnetic field generating components. This arrangement retains the benefit provided by the capacitors, while keeping them away from the sides of the coil, where they would otherwise take up valuable space and thereby limit the magnetic field generating capacity of the elements 32.

As shown in FIG. 2, the conductors 30 of the capacitors are interleaved with one another at the top and the bottom of the coil to make up the capacitors of the coil. Connection between the vertically-oriented capacitive fingers 30 and the vertical sections of the field generating elements 32 is made by the lateral portions 33, which extend inward at both the top and bottom of their range. For the field-generating elements 32 located on the left side of the coil (in the orientation shown in FIG. 2), one bend is inward along the bottom of the upper capacitive region. There, each of these lateral portions 33 connects to one of the capacitive fingers that, from there, extends vertically toward the top of the coil. These same field-generating elements also have a bend, at the bottom of their range from which lateral portions 33 extend inward along the bottom of the lower capacitive region. There, each of these lateral portions 33 connects to one of the capacitive fingers 30 that, from there, extends vertically away from the bottom of the coil. On the right side of the coil, the lateral portions 33 also extend inward at the top and bottom of the vertical sections of the magnetic field generating elements, connecting along the top of the coil to capacitive elements that, from there, extend downward toward the center of the coil. The lower lateral portions 33 extend inward to meet capacitive elements that, from there, extend upward toward the center of the coil.

Figure 2A:
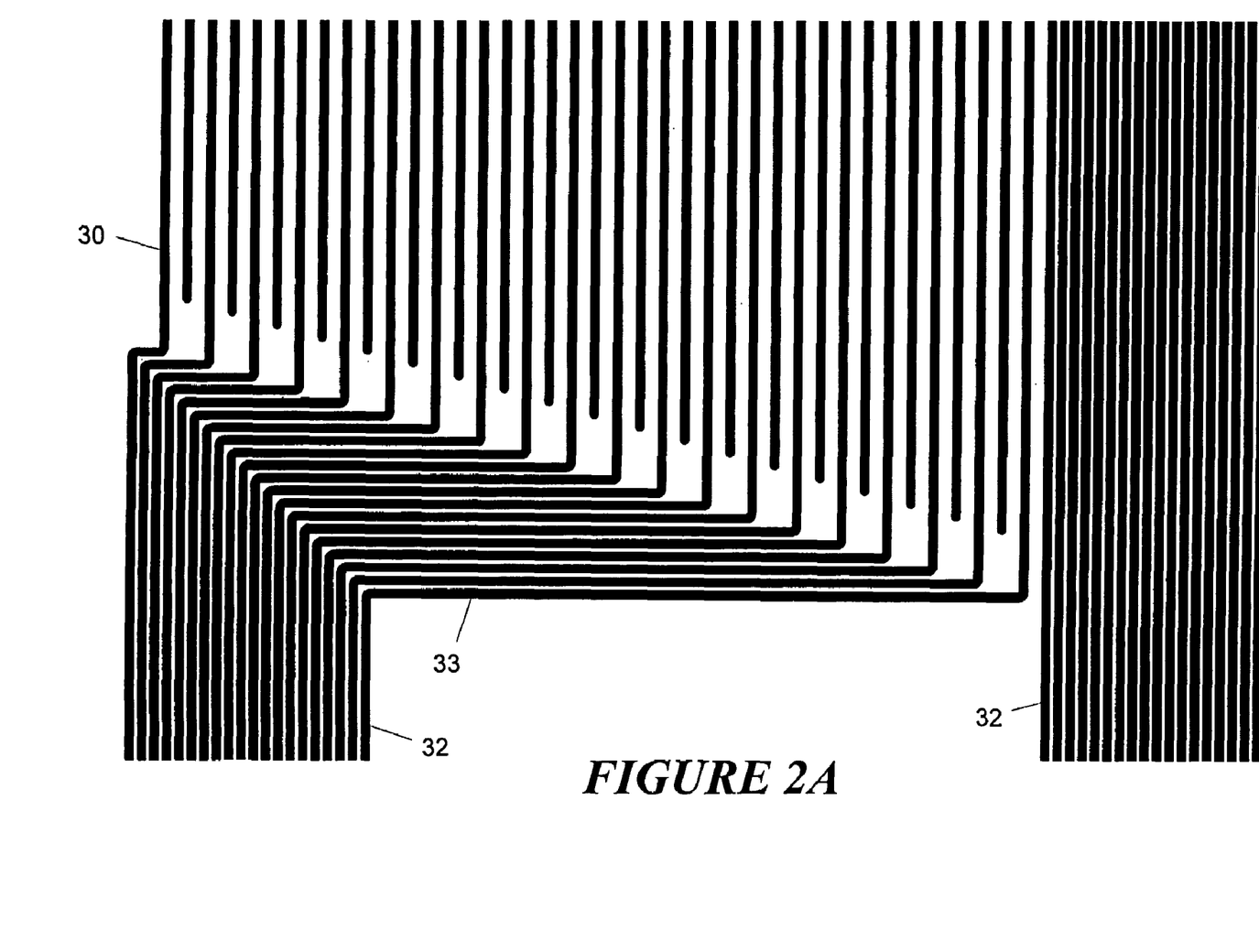
FIG. 2A is an isolated view of a portion of the schematic coil shown in FIG. 2.

In the embodiment of FIG. 2, the lateral portion 33 of each of the field-generating conductors 32 is connected to one of the capacitor fingers 30. This is shown more clearly in FIG. 2A, which is an enlarged view of the region 2A identified in FIG. 2. As shown, each finger that extends from a given field-generating conductor 32 interleaves with fingers connected to the field-generating elements located on the other side of the coil, thus creating a capacitive interleaving of the conductors from the two sides of the coil. In the embodiments of FIGS. 2 and 2A, the vertical position of the fingers decreases from the left side to the right side of the coil. This change in position allows room for the lateral portion 33 of each field-generating element to extend across the coil face to the point at which it connects to its respective capacitive finger, without crossing any of the other field-generating elements. As shown, the field-generating conductors 32 of the coil are necessarily different distances from the center of the coil, and so each contacts its respective finger at a different distance from the major axis of the coil. By extending the field-generating elements 32 horizontally only as far as they need go to contact the capacitive fingers, additional room is provided into which the fingers may be extended. Thus, as shown, the capacitors of the coil have an overall shape of a parallelogram. This geometry helps to maximize the capacitive connection between the two sides of the coil, while maintaining good symmetry across the coil.

As shown in FIGS. 2 and 2A, each capacitor conductor 30 is connected to the field-generating conductor array at one end, and lies adjacent to at least one capacitor conductor connected to a field-generating conductor that is part of the field-generating conductor array on the opposite side of the coil. Except for a small thickness of the conductors, the coil is located in the plane of the drawing page. As shown in the figures, the vertical portions of the field-generating conductors are straight and of uniform width. As mentioned above, these conductors 32 are separated from one another by a small amount (a "gaplet") so as to suppress the magnetization effects that would otherwise result when using superconducting material. However, by maximizing the width of the vertical elements, the amount of current that may be passed through the coil is also maximized, providing for the strongest possible field. In contrast to the vertical elements 32, the capacitive fingers 30 are further spaced apart. In one variation, the capacitor elements may be tapered from a maximum width, where they are connected to the field-generating elements, to a minimum width at the opposite side.

The separation between the fingers is maximized to reduce the electric field generated between adjacent fingers, while allowing for the same voltage drop as if they were closer together. Moreover, the gap between adjacent fingers can be kept constant throughout the coil so that the peak electric field is approximately the same between all of the different adjacent capacitor fingers. In another variation, however, the gap may be graded through the capacitor so that it is at a minimum between capacitor fingers connected to the innermost field generating elements, and maximum between the fingers connected to the outermost field-generating elements. Since somewhat higher voltage is induced in the outer loops of the coil, this allows the breakdown voltage of the coil is maximized. As shown, the ends of the fingers are also curved to minimize the risk of electrostatic discharge. The curvature may be such that the ends of the fingers approximate a semicircle.

As mentioned above, the capacitive fingers 30 of the coil shown in FIG. 2 are oriented parallel to the major axis of the coil. While therefore requiring the field-generating elements 32 to include a lateral portion 33 at either end of their vertical length, this orientation of the capacitive elements provides a significant advantage in reducing the potential for arcing within the coil. This advantage results from the relative orientation of the capacitive conductors relative to the static magnetic field applied across the coil during NMR spectroscopy. The following analysis may be useful in understanding how the relative orientation of the capacitive conductors affects the potential for coil arcing.

One common cause of arcing, and subsequent coil breakdown, is believed to be the liberation of one or more field-emitted electrons from the capacitor surfaces. In a prior art coil such as that shown in FIG. 1, the static magnetic field $B_0$ is parallel to the magnetic field-generating elements 22, as shown, and is therefore perpendicular to the capacitive conductors 24. Although the conductor lines have a small thickness, they may be coarsely approximated as being capacitive surfaces perpendicular to the $B_0$ direction. Thus, the electric field generated by the capacitors is parallel to the magnetic field. While this coil layout benefits from a certain degree of simplicity, its capacitor orientation therefore means that any field-emitted electrons in the capacitor region would be traveling in a direction parallel to the static magnetic field. As such, there is nothing to inhibit their acceleration toward an opposing capacitive surface, at which the impact of the electron could lead to additional free electrons, or ionization of free atoms and molecules, which in turn could be accelerated to create an avalanche breakdown. Given the peak voltages that occur in the presence of the RF field applied to the coil, the incidences of field-emitted electrons are high enough as to create a considerable fault scenario.

In contrast to prior art coils, the coil of FIG. 2 has its capacitive fingers (surfaces) positioned parallel to the direction of the static magnetic field. Thus, when a field-emitted electron a is freed from one of the capacitive surfaces, there is not only a force on it from the electric field between adjacent capacitive conductors, but also the magnetic field force in a direction perpendicular to the electron's velocity. The following analysis demonstrates that this gyromagnetic force, for typical values of electric and magnetic fields present in the subject NMR coils, is sufficient to prevent an emitted electron from reaching (and thereby damaging) the opposing electrode. How the electron is affected is perhaps better understood by viewing a simplified model.

Figure 3:
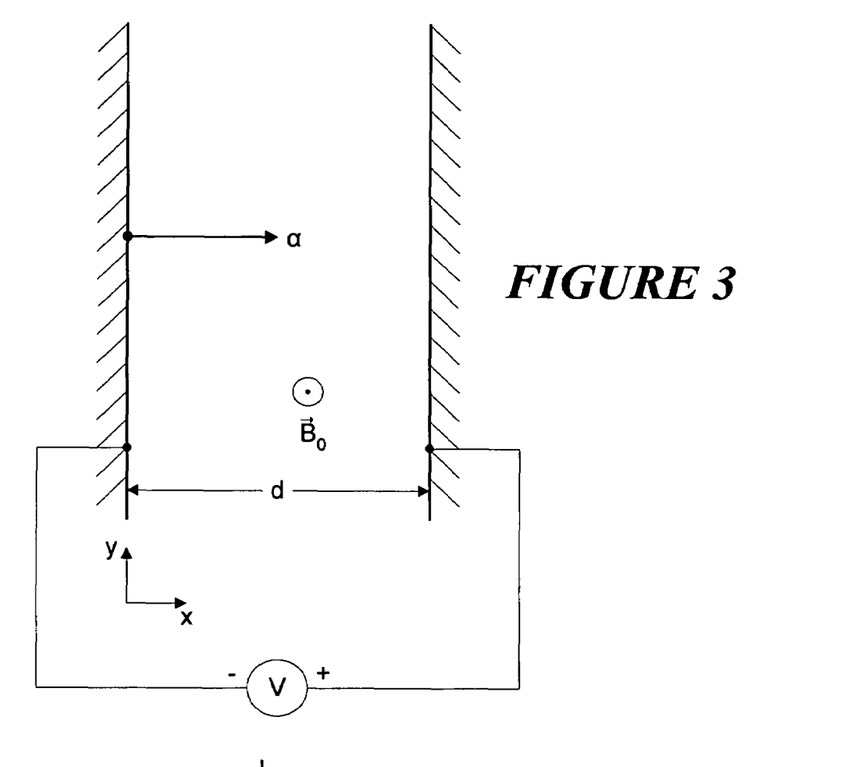
FIG. 3 is a diagrammatic view of a basic plate capacitor that resides in a static magnetic field.

FIG. 3 is a diagram of a parallel plate capacitor, the capacitive surfaces of which extend perpendicular to the plane of the page. For the purposes of this example, the electric field generated by the capacitor is much more uniform than in the coil, but it serves as a useful example nonetheless. As shown, an applied static magnetic field $B_0$ runs parallel to the surfaces, being directed out of the page. When an electron a is emitted from one of the plate surfaces, the force on it may be represented by:

$$\vec{F} = q\vec{E} + (q\vec{v} \times \vec{B})$$

where $q=-e$ is the electron charge ($e=1.6\times10^{-19}$ coulomb), $\vec{E}=-V/d\,\vec{i}_x$, $\vec{B}=B_0\,\vec{i}_z$, and $\vec{v}$ is the electron velocity. One can then write the equations of motion from $\vec{F}=m d\vec{v}/dt$ in x and y as:

$$\frac{dv_x}{dt} = \frac{q}{m}(E_0 + v_y B_0) \quad \frac{dv_y}{dt} = -\frac{qB_0}{m}v_x$$

where m is the electron mass and $E_0=-V/d$.

From the previous expressions, differentiating the first equation gives $$\frac{d^2 v_x}{dt^2} = -\left(\frac{qB_0}{m}\right)^2 v_x$$

which has the general solution $v_x = P \sin \omega_c t + Q \cos \omega_c t$, where $$\omega_c = \frac{qB_0}{m}$$

And, hence, integrating the second equation gives $$v_y = P \cos \omega_c t - Q \sin \omega_c t + R$$

where P, Q, and R are constants to be established by the initial conditions. Namely, it is assumed that, at t=0, the electron is emitted from the point x=0, y=0 with zero velocity. $v_x(t=0)=0$ requires that Q=0. vy(t=0) in turn requires that R=−P. Finally, at t=0, $dv_x/dt = qE_0/m$, so that $P=E_0/B_0$. Thus the velocities are:

$$v_x(t) = \frac{E_0}{B_0} \sin\omega_c t, \text{ and } v_x(t) = \frac{E_0}{B_0}(\cos\omega_c t - 1)$$

The position x, y of the electron may thus be described by:

$$x(t) = \frac{E_0}{B_0 \omega_c}(1 - \cos\omega_c t), \text{ and } y(t) = \frac{E_0}{B_0 \omega_c}(\sin\omega_c t - \omega_c t)$$

Figure 4:
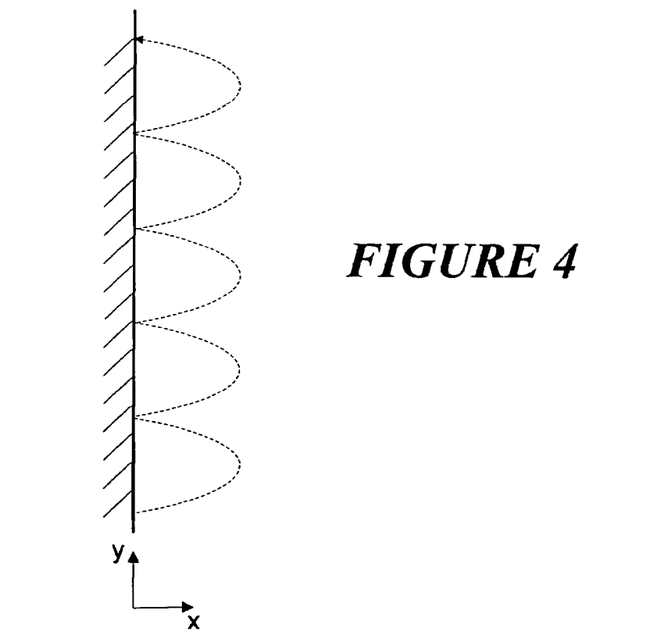
FIG. 4 is a diagrammatic view of free electron motion along the plate of an ideal capacitor in a static magnetic field.

The foregoing set of position equations for the electron in the x-y plane describe the simple sum of a circular motion with a radius $$\frac{E_0}{(B_0 \omega_c)} = \frac{mE_0}{qB_0^2},$$

and a steady motion in the y-direction having a velocity $E_0/B_0$. The path of the electron may therefore be represented by the diagram shown in FIG. 4. In this figure, the y-axis is compressed by a factor of η relative to the y-axis. Notably, the electron never travels further than $2mE_0/(qB_0^2)$ from its source electrode, and returns to the source electrode periodically, albeit with a zero kinetic energy and hence zero velocity. Thus, whereas the electrons reach a distance of $2E_0/(B_0\omega_c)$ from the source, they return to it every $2\pi E_0/(B_0\omega_c)$ along y.

Using the foregoing analysis, if there were a voltage drop of 1000 volts between plates separated by 20 μm, and the plates were located in a 14.1 tesla (T) magnet, which is commonly used for an NMR spectrometer operating at a 600 MHz hydrogen ($^1$H) (or "proton") frequency, one would find that:

$$\omega_c = \frac{qB_0}{m} = 2\pi f_c$$

where $f_c$=394.6 GHz, the well known cyclotron frequency. In addition, the average velocity in the y-direction may be found as follows:

$$|v_y| = \frac{E_0}{B_0} = 3.55 \times 10^6 \text{ m/s}$$

This velocity may be referred to as the "motion of the guiding center," that is, how the rotational path of the electron itself proceeds along the y-axis.

Perhaps most importantly, the maximum travel toward the counter electrode may be found to be:

$$X_{max} = \frac{2}{\omega_c} \frac{E_0}{B_0} = 2.86 \text{ μm}$$

Notably, the trajectory of the electron is the same as that of a point on the circumference of a wheel as that wheel is rolled in a straight line. The average velocity in the y-direction, of course, is analogous to the velocity of the center of the wheel.

It should be remembered that the above analysis relies on an ideal case. There are three disparate time scales, the shortest being that of the electron orbit, which is determined by $\omega_c$ and, therefore, at a magnetic field strength of 14.1 T, has a period of 2.53 ps. The next time scale is that of the RF electric field in the coil which, at 14.1 T (and for a carbon resonance of 150.91 MHz), has a period of 6.6 ns, nearly 3000 times longer than the electron orbits. Thus far in the analysis, the electric field has been presumed to be static. However, based on the foregoing observation, the field may be, at best, treated as quasi-static, in that there are only very minute changes in $E_0$ from one orbital period to the next. The longest time constant is the decay of the electron energy by radiation. This time constant is, in cgs units, $$\tau = 3R^5 m^3/(4q^4 B^2) = 2.6 \times 10^8 / B^2$$

or 13 ms in a 14.1 T field. This is about six orders of magnitude greater than even the RF period. However, it still indicates that any loose electron will be significantly reduced in energy by the end of the NMR experiment.

The effects of the time-varying electric field should also be considered. As an example, an electron might be emitted at some time prior to the electric field reaching a peak in its RF cycle. In such a case, at the end of each period of electron orbit, and until the electric field reaches the peak of the cycle, the source electrode would be at a slightly higher potential (lower voltage), and the electron will not quite be able to reach it. (Notably, except for the radiation loss, this is an electrostatically conservative situation. The magnetic force is perpendicular to the electron velocity and, hence, does not change the electron energy. The sum of the electron's kinetic energy and electrical energy is constant). The electron will fall further and further short of reaching the electrode with each orbit. When the field (and potential) are the same as when the electron was emitted, the electron will again reach the electrode, but with nearly zero energy. Upon each subsequent orbit until the RF field reaches zero, the electron will reach the electrode with a finite amount of kinetic energy. Because of the great disparity in time scales, however, this "excess" energy is small, and estimated to be on the order of 0.1 eV for typical NMR coil parameters. This is far below the energy needed for secondary emission, ionization, etc. and would be harmlessly dissipated into phonons (i.e., heat). The electron would leave the electrode on the next RF cycle with zero energy, so that this "excess" energy would not be accumulated over multiple RF cycles.

Figure 5:
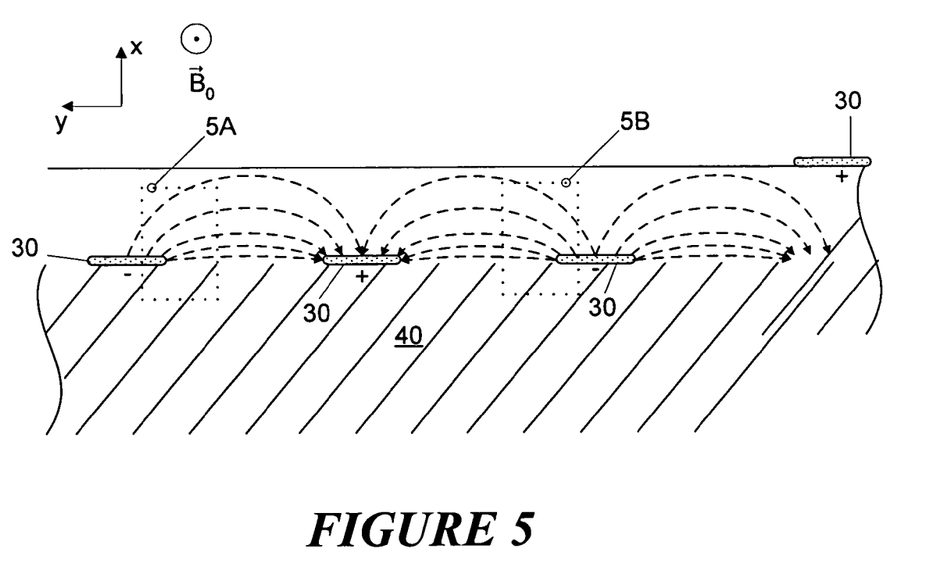
FIG. 5 is a schematic view of a section of an interdigital capacitor in a coil according to the present invention that shows electric force lines at a given moment in time.

FIG. 5 is a schematic, cross-sectional view of a region of a coil such as that shown in FIG. 2. The figure shows several of the capacitor conductors 30 residing on substrate 40. As shown, the adjacent conductors are alternately labeled with a "+" or a "−" sign, indicating their relative voltage potentials at a particular point in time. Obviously, since the RF voltage is alternating, these symbols indicate only that the voltages on adjacent conductors are 180° out of phase. Nevertheless, this representation demonstrates relative electric field potentials at a given time. Electric force lines are represented in the figure by dashed lines with arrowheads indicating their direction. The electric force lines are the opposite of the electric field lines, and show the force that acts on an electron. As shown, the electric force flows from the low potential "−" conductors to the high potential "+" conductors. This coil may, for example, have RF potential at the $^{13}$C resonant frequency of 150.91 MHz in a magnetic field of 14.1 T. Typical capacitor conductor widths in such a coil could be from 10 μm to 40 μm with gaps from 20 μm to 80 μm. Different dimensions in these ranges may depend on the overall coil size, since coils used for different experimental purposes may have different sizes, and may also depend on the number of series capacitors used for a given coil design.

Figure 5A:
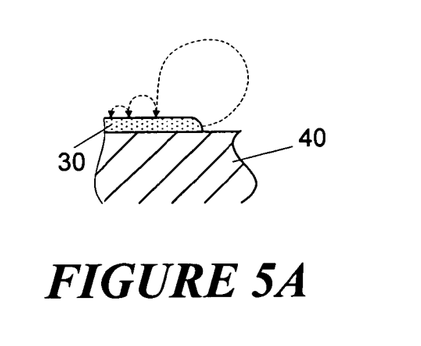
FIG. 5A is a schematic view of an isolated portion of a capacitor like that of FIG. 5 showing a possible trajectory of an emitted electron along one side of a capacitor conductor.
Figure 5B:
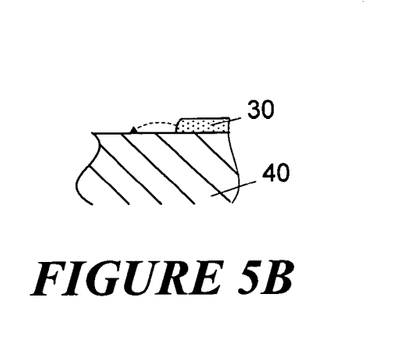
FIG. 5B is a schematic view of an isolated view of a portion of a capacitor like that of FIG. 5 showing a possible trajectory of an emitted electron along a side of a capacitor conductor opposite that shown in FIG. 5A.

Also shown in FIG. 5 are two regions enclosed by dotted lines and labeled, respectively, "5A" and "5B." These regions identify isolated sections that are depicted, respectively, in FIGS. 5A and 5B, and which are used to demonstrate what is thought to be the likely electron motion near the capacitor conductors. In FIG. 5A, the path of an electron emitted from the edge of the conductor shown is approximated. Electron emission is most likely to occur near the edge, as this is where the electric field is the highest. The electron begins to travel along the electric field vector, but is soon deflected in a counter-clockwise orbit by the $q\vec{v} \times \vec{B}$ magnetic force. As shown, the electron curves around back to the emitting electrode and is likely to be re-emitted. However, the electric field is weaker away from the edge, and the resulting orbit is smaller. The electron again returns to the electrode, and is again re-emitted. This process may continue until the electron finds its way to the left edge of the conductor, where the electric field is again strong, but this would result in a situation as depicted in FIG. 5B.

An electron that may be emitted, or re-emitted, from the other side of the conductor, as shown in FIG. 5B. But, given the polarities shown in FIG. 5, the magnetic force would tend to direct the electron toward the substrate, and frictional forces would limit the amount of energy that it could gain. It is unlikely that the electron could gain sufficient energy at this point to cause ionization or secondary electron emission at an adjacent electrode. Thus, the likelihood of arcing in the coil is significantly reduced.

The embodiment of FIG. 2 and the foregoing example are directed to a coil having capacitive conductors that are oriented so that the electric field they generate is directly perpendicular to the static magnetic field of the system. However, it is recognized that the field need not be exactly perpendicular to obtain the benefits of the invention. While it is desirable to segregate the capacitive conductors to a region of the coil further from the sample volume than the magnetic field generating conductors, the orientation of the conductors is based on the desire to reduce the potential for arcing in the coil. The reduction in this potential is maximized when the electric and magnetic fields are perpendicular to each other, but it is still possible to keep the arcing potential relatively low by orienting the fields so that they are not exactly perpendicular to each other, but so that the static magnetic field limits electron acceleration in a given direction.

Determining an appropriate relative angle between the direction of the electric fields and the direction of the static magnetic field should take into account the overall nature of the coil. An NMR coil is an electromagnetic resonator, specifically designed to apply a large RF magnetic field to a sample in a direction perpendicular to the direction of the static magnetic field. In an electromagnetic resonator, energy is constantly being exchanged between magnetic and electric forms, the exchange taking place each half-cycle of resonance, and the peak electric energy $(W_e)_{peak}$ is equal to the peak magnetic energy $(W_m)_{peak}$. Thus, a coil designed to project a certain RF magnetic field intensity upon a sample of a certain volume must also be capable of storing a known amount of electric energy. Electromagnetic resonators by necessity produce RF electric fields, and it is desirable to minimize the influence of these electric fields on the sample to avoid losses and additional signal noise. It is also desirable to store this electric energy in a manner that does not result in arcing.

The energy stored in the electric field can be written as:

$$W_e = 0.5 \int (\epsilon |\vec{E}|^2 dV)$$

where $\epsilon$ is the electrical permittivity of space for the material filling the space and $\vec{E}$ is the RF electric field vector in volts/meter, and the integral is over the volume in and around the NMR probe. For free space, $\epsilon = \epsilon_0 = 8.85 \times 10^{-12}$ Farads/meter, and for a sapphire substrate material, the value of $\epsilon$ is approximately ten times higher, or $\epsilon = 8.85 \times 10^{-11}$ Farads/meter. (Technically, for anisotropic dielectrics such as sapphire, the integral is of the vector dot product of the displacement field $\vec{D} = \epsilon \times \vec{E}$ and the electric field $\vec{E}$, where $\vec{D}$ is the vector product of the tensor $\epsilon$ and the vector $\vec{E}$. However, to a very close approximation we can use the average dielectric constant and the square of the electric field).

Like the electric field energy, the energy stored in the magnetic field can be quantified as:

$$W_m = 0.5 \int (\mu \vec{H}^2 dV)$$

where $\mu$ is the magnetic permeability of space for the material filling the space and $\vec{H}$ is the RF magnetic field vector in amperes/meter, and the integral is over the volume in and around the NMR probe. The value $\mu = \mu_0 = 4\pi \times 10^{-7}$ Henries/meter for free space, and this value is a close approximation for all materials that might be used in an NMR probe.

With the static magnetic field being along the direction of the z axis, it is thus a goal of the invention to ensure that the vast majority of the electric energy is stored in electric field components perpendicular to z, such that:

$$\int [\epsilon(E_x^2 + E_y^2) dV] >> \int [\epsilon E_z^2 dV]$$

It is also a goal of the invention to ensure that the peak (over the volume) electric field along the z axis is much less than that in the transverse plane, such that:

$$(E_z^2)_{peak} << (E_x^2 + E_y^2)_{peak}$$

For design purposes, a practical embodiment of this criterion would ensure that $(E_z^2)_{peak}$, the square of the peak electric field in the z-direction (i.e., in the direction of the static magnetic field), is less than 10% of $(E_x^2 + E_x^2)_{peak}$, the peak of the sum of the squares of the electric field components in each of the two perpendicular directions.

While the invention has been shown and described with reference to a preferred embodiment therefore, those skilled in the art will recognize that various changes in form and detail may be made herein without departing from the spirit and scope of the invention as defined by the appended claims. For example, the coil shown in FIG. 2 has capacitive conductors oriented exactly parallel to the main static magnetic field. However, as mentioned above, coils may experience a reduction in arcing failures without necessarily having the capacitive conductors at this particular orientation. Those skilled in the art will recognize that different orientations of the conductors relative to the magnetic field can still result in a reduction of arcing, by using the magnetic field to help control the direction and acceleration of an emitted electron.

What is claimed is:

1. A magnetic resonance radio frequency resonator that generates a radio frequency magnetic field in an active sample volume, the magnetic resonance radio frequency resonator comprising:
a dielectric substrate; and
a conductive material deposited on the dielectric substrate and forming a plurality of nested current carrying loops each of which has magnetic field generating elements and interdigital capacitor elements, the current carrying loops forming a substantially closed geometric path surrounding an inner region that lies adjacent to the active sample volume, wherein the magnetic field generating elements form part of the closed geometric path and substantially all of the interdigital capacitor elements are in a region outside the closed geometric path and are oriented in a direction substantially parallel to the orientation of the magnetic field generating elements.

2. A magnetic resonance radio frequency resonator according to claim 1 wherein the resonator is configured to be located in a static magnetic field in a particular orientation and, when in said particular orientation, the interdigital capacitor elements are oriented parallel to the static magnetic field.

3. A magnetic resonance radio frequency resonator according to claim 1 wherein the conductive material is a superconductor.

4. A magnetic resonance radio frequency resonator according to claim 1 wherein said inner region has a substantially oblong shape, and the magnetic field generating elements comprise electrical conductors that run substantially parallel to a major axis of the oblong shape.

5. A magnetic resonance radio frequency resonator according to claim 4 wherein the interdigital capacitor elements comprise electrical conductors that run substantially parallel to said major axis of the oblong shape.

6. A magnetic resonance radio frequency resonator according to claim 5 wherein the interdigital capacitor elements are located adjacent to the shorter sides of said oblong shape.

7. A magnetic resonance radio frequency resonator according to claim 4 wherein the interdigital capacitor elements comprise conducting fingers separated by non-conducting gaps that also extend in a direction parallel to said major axis.

8. A magnetic resonance radio frequency resonator according to claim 4 wherein the respective lengths of the magnetic field generating elements vary relative to their distance from a center of the oblong shape.

9. A magnetic resonance radio frequency resonator according to claim 4 wherein the magnetic field generating elements further comprise lateral portions that run substantially perpendicular to said major axis, and that connect to respective interdigital capacitor elements.

10. A magnetic resonance radio frequency resonator according to claim 4 wherein, together, a portion of said the conductors of the magnetic field generating elements that are located to one side of the oblong shape occupy a space having a substantially trapezoidal shape.

11. A magnetic resonance radio frequency resonator according to claim 1 wherein the interdigital capacitor elements together make up a plurality of capacitors connected in series with the magnetic field generating elements.

12. A magnetic resonance radio frequency resonator that is located in a static magnetic field and that generates a radio frequency magnetic field in an active sample volume, the magnetic resonance radio frequency resonator comprising:
a dielectric substrate; and
a conductive material deposited on the dielectric substrate and forming a plurality of nested current carrying loops each of which has magnetic field generating elements and interdigital capacitor elements that are separate from the magnetic field generating elements and that generate electric field components, the current carrying loops forming a substantially closed geometric path surrounding an inner region that lies adjacent to the active sample volume, wherein the magnetic field generating elements form part of the closed geometric path and the interdigital capacitor elements are in a region outside the closed geometric path and are oriented such that the square of the peak electric field in the direction of the static magnetic field is less than 10% of the peak of the sum of the squares of the electric field components in each of the two perpendicular directions.

13. A magnetic resonance radio frequency resonator according to claim 12 wherein the conductive material is a superconductor.

14. A magnetic resonance radio frequency resonator according to claim 12 wherein said inner region has a substantially oblong shape, and the magnetic field generating elements comprise electrical conductors that run substantially parallel to a major axis of the oblong shape.

15. A magnetic resonance radio frequency resonator according to claim 14 wherein the interdigital capacitor elements comprise electrical conductors that run substantially parallel to said major axis of the oblong shape.

16. A magnetic resonance radio frequency resonator according to claim 15 wherein the interdigital capacitor elements are located adjacent to the shorter sides of said oblong shape.

17. A magnetic resonance radio frequency resonator according to claim 14 wherein the interdigital capacitor elements comprise conducting fingers separated by non-conducting gaps that also extend in a direction parallel to said major axis.

18. A magnetic resonance radio frequency resonator according to claim 14 wherein the respective lengths of the magnetic field generating elements vary relative to their distance from a center of the oblong shape.

19. A magnetic resonance radio frequency resonator according to claim 14 wherein the magnetic field generating elements further comprise lateral portions that run substantially perpendicular to said major axis, and that connect to respective interdigital capacitor elements.

20. A magnetic resonance radio frequency resonator according to claim 14 wherein, together, a portion of said the conductors of the magnetic field generating elements that are located to one side of the oblong shape occupy a space having a substantially trapezoidal shape.

21. A magnetic resonance radio frequency resonator according to claim 12 wherein the interdigital capacitor elements together make up a plurality of capacitors connected in series with the magnetic field generating elements.

22. A magnetic resonance radio frequency resonator that is located in a static magnetic field and that generates a radio frequency magnetic field in an active sample volume, the magnetic resonance radio frequency resonator comprising:
a dielectric substrate; and
a conductive material deposited on the dielectric substrate and forming a plurality of nested current carrying loops each of which has magnetic field generating elements and interdigital capacitor elements that are separate from the magnetic field generating elements, the current carrying loops forming a substantially closed geometric path surrounding an inner region that lies adjacent to the active sample volume, wherein the magnetic field generating elements form part of the closed geometric path and substantially all of the interdigital capacitor elements are in a region outside of the closed geometric path and are oriented in a direction substantially parallel to the direction of the static magnetic field.

23. A resonant magnetic field coil for an NMR spectrometer that generates a radio frequency magnetic field in an active sample volume, the coil comprising:
a planar dielectric substrate; and
a high-temperature superconductor material deposited on the dielectric substrate and forming a plurality of nested current carrying loops each of which has magnetic field generating elements and interdigital capacitor elements, the current carrying loops forming a substantially closed geometric path surrounding an inner region that has a substantially oblong shape and lies adjacent to the active sample volume, wherein the magnetic field generating elements comprise electrical conductors that run substantially parallel to a major axis of the oblong shape and form part of the closed geometric path and the interdigital capacitor elements comprise electrical conductors that run substantially parallel to said major axis of the oblong shape, and wherein substantially all of the interdigital capacitor elements are located in a region outside the closed geometric path.

24. A method of making a magnetic resonance radio frequency resonator that generates a radio frequency magnetic field in an active sample volume, the method comprising:
providing a planar dielectric substrate; and
depositing a conductive material on the dielectric substrate to form a plurality of nested current carrying loops each of which has magnetic field generating elements and interdigital capacitor elements, the current carrying loops forming a substantially closed geometric path surrounding an inner region that lies adjacent to the active sample volume, wherein the magnetic field generating elements form part of the closed geometric path and substantially all of the interdigital capacitor elements are in a region outside of the closed geometric path and are oriented in a direction substantially parallel to the orientation of the magnetic field generating elements.

25. A method according to claim 24 wherein the resonator is configured to be located in a static magnetic field in a particular orientation and, when in said particular orientation, the interdigital capacitor elements are oriented parallel to the static magnetic field.

26. A method according to claim 24 wherein the conductive material is a superconductor.

27. A method according to claim 24 wherein said inner region has a substantially oblong shape, and the magnetic field generating elements comprise electrical conductors that run substantially parallel to a major axis of the oblong shape.

28. A method according to claim 27 wherein the interdigital capacitor elements comprise electrical conductors that run substantially parallel to said major axis of the oblong shape.

29. A method according to claim 28 wherein the interdigital capacitor elements are located adjacent to the shorter sides of said oblong shape.

30. A method according to claim 27 wherein the interdigital capacitor elements comprise conducting fingers separated by non-conducting gaps that also extend in a direction parallel to said major axis.

31. A method according to claim 27 wherein the respective lengths of the magnetic field generating elements vary relative to their distance from a center of the oblong shape.

32. A method according to claim 27 wherein the magnetic field generating elements further comprise lateral portions that run substantially perpendicular to said major axis, and that connect to respective interdigital capacitor elements.

33. A method according to claim 27 wherein, together, a portion of said the conductors of the magnetic field generating elements that are located to one side of the oblong shape occupy a space having a substantially trapezoidal shape.

34. A method according to claim 24 wherein the interdigital capacitor elements together make up a plurality of capacitors connected in series with the magnetic field generating elements.

* * * * *